US012742811B1

(12) United States Patent
Chen et al.

(10) Patent No.: US 12,742,811 B1
(45) Date of Patent: Sep. 22, 2026

(54) METHODS FOR JOINT POWER FLOW CALCULATION OF MASTER-SLAVE SYSTEMS BASED ON GRID-FOLLOWING IMPEDANCE

(71) Applicant: ZHEJIANG UNIVERSITY OF SCIENCE & TECHNOLOGY, Hangzhou (CN)

(72) Inventors: Mengxiao Chen, Hangzhou (CN); Wei Liu, Hangzhou (CN); Bomiao Liang, Hangzhou (CN)

(73) Assignee: ZHEJIANG UNIVERSITY OF SCIENCE & TECHNOLOGY, Hangzhou (CN)

( * ) Notice: Subject to any disclaimer, the term of this patent is extended or adjusted under 35 U.S.C. 154(b) by 0 days.

(21) Appl. No.: 19/661,654

(22) Filed: Apr. 28, 2026

(30) Foreign Application Priority Data

Mar. 4, 2026 (CN) ........................ 202610256268.4

(51) Int. Cl.
*H02J 3/1821* (2026.01)
*G01R 31/08* (2020.01)
*H02J 3/001* (2026.01)
*H02J 3/38* (2026.01)

(52) U.S. Cl.
CPC ........ *G01R 31/086* (2013.01); *H02J 3/00125* (2020.01); *H02J 3/1821* (2013.01); *H02J 3/38* (2013.01)

(58) Field of Classification Search
CPC .. G01R 31/086; H02J 3/00125; H02J 3/1821; H02J 3/38
See application file for complete search history.

(56) References Cited

FOREIGN PATENT DOCUMENTS

CN 111463794 A * 7/2020 ................ H02J 3/06

OTHER PUBLICATIONS

"Master-Slave-Splitting Based Distributed Global Power Flow Method for Integrated Transmission and Distribution Analysis" from "IEEE Transactions on Smart Grid, vol. 6, No. 3, May 2015" (Year: 2015).*

* cited by examiner

*Primary Examiner* — Yuhui R Pan
(74) *Attorney, Agent, or Firm* — PORUS IP LLC

(57) ABSTRACT

Provided is a method for joint power flow calculation of master-slave systems based on grid-following impedance, the method including: setting a voltage of a boundary node to an initial value; setting power of the boundary node as a real slave system power, calculating power flow of a master system, and obtaining corresponding elements between a voltage magnitude correction value of the boundary node and an active power imbalance and a reactive power imbalance of the boundary node respectively in an inverse Jacobian matrix; calculating grid-following impedance according to the corresponding elements, the voltage of the boundary node, and the slave system power, and further calculating a voltage of a virtual slack node; and calculating power flow of a virtual slave system based on the grid-following impedance and the voltage of the virtual slack node, and updating the slave system power.

20 Claims, 7 Drawing Sheets

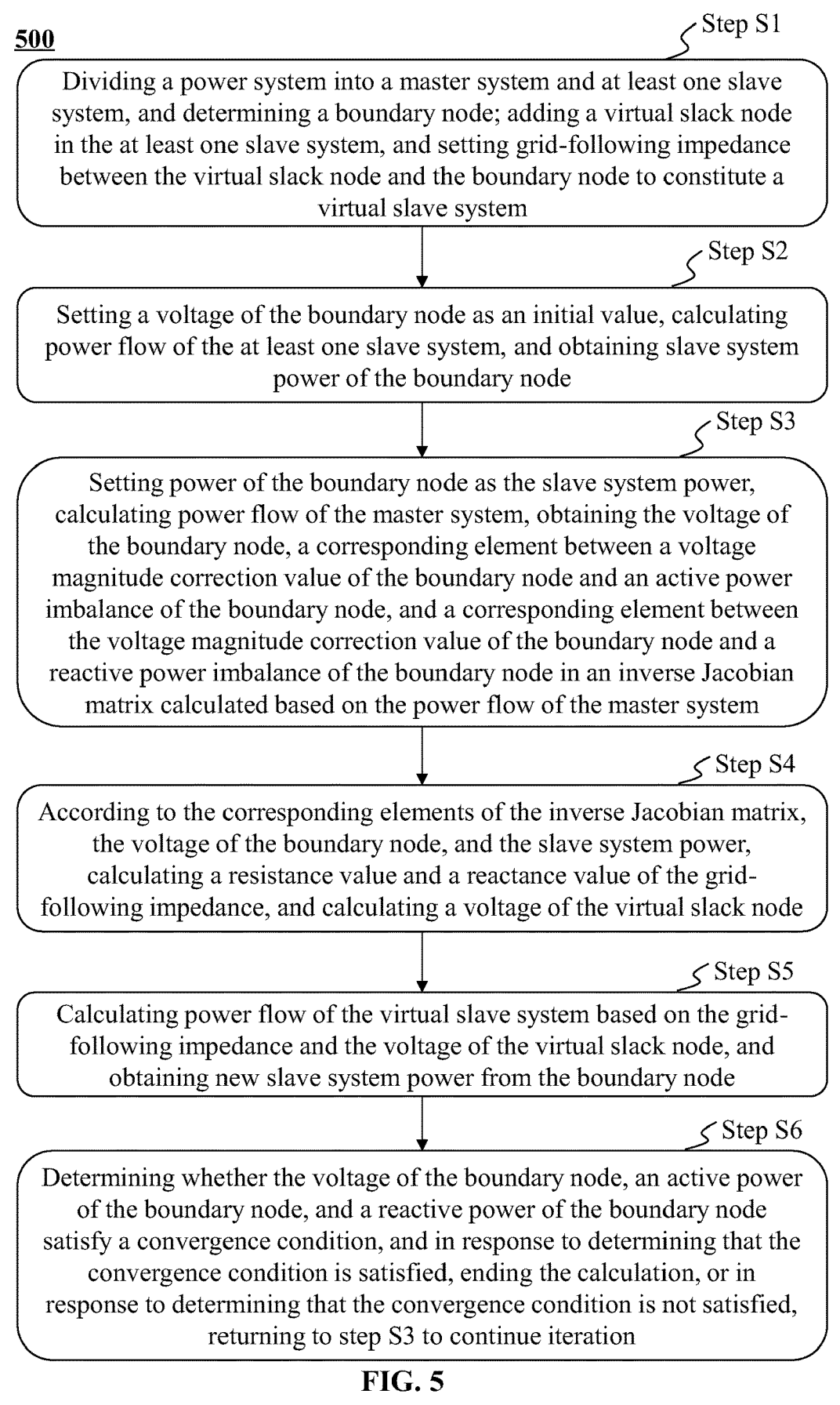

500

Step S1

Dividing a power system into a master system and at least one slave system, and determining a boundary node; adding a virtual slack node in the at least one slave system, and setting grid-following impedance between the virtual slack node and the boundary node to constitute a virtual slave system Step S2

Setting a voltage of the boundary node as an initial value, calculating power flow of the at least one slave system, and obtaining slave system power of the boundary node Step S3

Setting power of the boundary node as the slave system power, calculating power flow of the master system, obtaining the voltage of the boundary node, a corresponding element between a voltage magnitude correction value of the boundary node and an active power imbalance of the boundary node, and a corresponding element between the voltage magnitude correction value of the boundary node and a reactive power imbalance of the boundary node in an inverse Jacobian matrix calculated based on the power flow of the master system Step S4

According to the corresponding elements of the inverse Jacobian matrix, the voltage of the boundary node, and the slave system power, calculating a resistance value and a reactance value of the grid-following impedance, and calculating a voltage of the virtual slack node Step S5

Calculating power flow of the virtual slave system based on the grid-following impedance and the voltage of the virtual slack node, and obtaining new slave system power from the boundary node Step S6

Determining whether the voltage of the boundary node, an active power of the boundary node, and a reactive power of the boundary node satisfy a convergence condition, and in response to determining that the convergence condition is satisfied, ending the calculation, or in response to determining that the convergence condition is not satisfied, returning to step S3 to continue iteration

FIG. 5

METHODS FOR JOINT POWER FLOW CALCULATION OF MASTER-SLAVE SYSTEMS BASED ON GRID-FOLLOWING IMPEDANCE

CROSS-REFERENCE TO RELATED APPLICATIONS

This application claims priority to Chinese Application No. 202610256268.4, filed on Mar. 4, 2026, the entire contents of which are incorporated herein by reference.

TECHNICAL FIELD

The present disclosure relates to the field of smart grids, and in particular, to a method for joint power flow calculation of master-slave systems based on grid-following impedance.

BACKGROUND

Against the backdrop of the accelerated construction of new power systems and the high penetration of new energy becoming a core feature, the structural form, operational mechanisms, and dispatching modes of power systems are undergoing fundamental changes, creating an urgent demand for the development of power flow calculation technologies.

In traditional power system power flow calculation, the power flow calculation of transmission networks and distribution networks is in a fragmented state. When calculating the power flow of the transmission network, the distribution network is treated as an equivalent load, and the load power data is known and given. When calculating the power flow of the distribution network, the transmission network is considered as an equivalent power source, and the voltage value of the root node is known and given. Consequently, significant power mismatch and voltage mismatch exist at a boundary node, and the overall coupling characteristics of the system cannot be reflected.

With the large-scale integration of new energy sources such as wind power and photovoltaics, distributed generation (DG) has widely penetrated the distribution network side, transforming traditional radial distribution networks into complex networks with "source-load interweaving", where the direction of power flow changes from unidirectional flow to bidirectional interaction. The physical boundaries between transmission and distribution networks are gradually blurring, and the limitations of traditional decoupled power flow calculation are greatly amplified, making it difficult to adapt to the globalized and dynamic needs of new power systems.

The technology for joint power flow calculation of master-slave systems has emerged accordingly. The core logic originates from the master-slave physical characteristics of power systems: a transmission network serves as a master system, undertaking global power balance and voltage support; a distribution network serves as a slave system, and the state of the slave system mainly depends on the master system. The master system and the slave system perform power flow calculations separately. Subsequently, voltage and power are interactively updated at the boundary, and iterations are repeated until convergence. However, the traditional method for joint power flow calculation of master-slave systems requires a large number of iterations, involves substantial computational burden, and exhibits low efficiency.

The principle of joint power flow calculation for master-slave systems is as follows:

1) A power system is divided into a master system and a slave system, as shown in FIG. 1. In an actual power grid, a typical dividing manner uses a low-voltage busbar of a substation as a boundary node, uses a transmission network as the master system, and uses a distribution network as the slave system. A plurality of slave systems may exist.
2) The master system is simplified to a power source voltage at the boundary node, as shown in FIG. 2, and the slave system independently calculates the power flow. During the calculation process, the boundary node is typically treated as a slack node (where the voltage magnitude and phase angle are known, and the active power and reactive power are to be determined).
3) The slave system is simplified to a load power at the boundary node, as shown in FIG. 3, and the master system independently calculates the power flow. During the calculation process, the boundary node is typically treated as a PQ node (where the active power and reactive power are known, and the voltage magnitude and phase angle are to be determined).
4) Based on the respective power flow calculation results of the master system and the slave system, the electrical quantities at the boundary node are updated, and a joint iterative calculation of the master and slave systems is performed.

As can be seen from the above, the process of joint power flow calculation for master-slave systems in the prior art requires repeated iterations between the master system and the slave system. Since the method involves completely ignoring the coupling relationship between the master system and the slave system when each independently calculates the power flow, the joint power flow calculation of the master-slave systems requires a large count of iterations and involves substantial computational burden.

Therefore, it is necessary to provide a method for joint power flow calculation of master-slave systems based on grid-following impedance, which is used to add a virtual grid-following impedance in the power flow calculation of the slave system to simulate the voltage-power coupling relationship between the master system and the slave system, so that the power flow calculation result of the slave system is closer to the true value, thereby reducing the count of master-slave iterations and improving calculation efficiency.

SUMMARY

To address the deficiencies in the prior art, the present disclosure provides a method for joint power flow calculation of master-slave systems based on grid-following impedance.

One or more embodiments of the present disclosure provide a method for joint power flow calculation of master-slave systems based on grid-following impedance, the method comprising the following steps: step S1, dividing a power system into a master system and at least one slave system, and determining a boundary node; adding a virtual slack node in the at least one slave system, and setting a grid-following impedance between the virtual slack node and the boundary node to constitute a virtual slave system; step S2, setting a voltage of the boundary node as an initial value, calculating a power flow of the at least one slave system, and obtaining a slave system power of the boundary node; step S3, setting a power of the boundary node as the slave system power, calculating a power flow of the master system, obtaining the voltage of the boundary node, and a corresponding element between a voltage magnitude correction value of the boundary node and an active power imbalance of the boundary node and a corresponding element between the voltage magnitude correction value of the boundary node and a reactive power imbalance of the boundary node in an inverse Jacobian matrix calculated based on the power flow of the master system; step S4, according to the corresponding elements of the inverse Jacobian matrix, the voltage of the boundary node, and the slave system power, calculating a resistance value and a reactance value of the grid-following impedance, and calculating a voltage of the virtual slack node; step S5, calculating a power flow of the virtual slave system based on the grid-following impedance and the voltage of the virtual slack node, and obtaining a new slave system power from the boundary node; step S6, determining whether the voltage of the boundary node, an active power of the boundary node, and a reactive power of the boundary node satisfy a convergence condition, and in response to determining that the convergence condition is satisfied, ending the calculation, or in response to determining that the convergence condition is not satisfied, returning to step S3 to continue iteration; the resistance value of the grid-following impedance is determined by multiplying the voltage of the boundary node by the corresponding element between the voltage magnitude correction value of the boundary node and the active power imbalance of the boundary node in the inverse Jacobian matrix; the reactance value of the grid-following impedance is determined by multiplying the voltage of the boundary node by the corresponding element between the voltage magnitude correction value of the boundary node and the reactive power imbalance of the boundary node in the inverse Jacobian matrix.

One or more embodiments of the present disclosure provide a system for joint power flow calculation of master-slave systems based on grid-following impedance. The system includes: a system partition module, configured to: divide a power system into a master system and at least one slave system, and determine a boundary node; add a virtual slack node in the at least one slave system, and set grid-following impedance between the virtual slack node and the boundary node to constitute a virtual slave system; an initial value calculation module, configured to: set a voltage of the boundary node as an initial value, calculate power flow of the at least one slave system, and obtain slave system power of the boundary node; a master system calculation module, configured to: set power of the boundary node as the slave system power, calculate power flow of the master system, obtain the voltage of the boundary node and a corresponding element between a voltage magnitude correction value of the boundary node and an active power imbalance of the boundary node, and a corresponding element between the voltage magnitude correction value of the boundary node and a reactive power imbalance of the boundary node in an inverse Jacobian matrix calculated based on the power flow of the master system; an impedance determination module, configured to: according to the corresponding elements of the inverse Jacobian matrix, the voltage of the boundary node, and the slave system power, calculate a resistance value and a reactance value of the grid-following impedance, and calculate a voltage of the virtual slack node; a virtual power flow module, configured to: calculate power flow of the virtual slave system based on the grid-following impedance and the voltage of the virtual slack node, and obtain new slave system power from the boundary node; a convergence determination module, configured to: determine whether the voltage of the boundary node, the active power of the boundary node, and the reactive power of the boundary node satisfy a convergence condition, and in response to determining that the convergence condition is satisfied, end the calculation, or in response to determining that the convergence condition is not satisfied, return to step S3 to continue iteration; wherein the resistance value of the grid-following impedance is determined by multiplying the voltage of the boundary node by the corresponding element between the voltage magnitude correction value of the boundary node and the active power imbalance of the boundary node in the inverse Jacobian matrix; and the reactance value of the grid-following impedance is determined by multiplying the voltage of the boundary node by the corresponding element between the voltage magnitude correction value of the boundary node and the reactive power imbalance of the boundary node in the inverse Jacobian matrix.

One or more embodiments of the present disclosure provide a non-transitory computer-readable storage medium, the storage medium storing computer instructions, wherein when a computer reads the computer instructions in the storage medium, the computer executes the method for joint power flow calculation of master-slave systems based on grid-following impedance as described above.

BRIEF DESCRIPTION OF THE DRAWINGS

The present disclosure will be further described by way of exemplary embodiments, which are detailed in the accompanying drawings. These embodiments are non-limiting, wherein like reference numerals designate like structures throughout the description.

FIG. 5 is a flowchart illustrating an exemplary method for joint power flow calculation of master-slave systems based on grid-following impedance according to some embodiments of the present disclosure;

DETAILED DESCRIPTION

It should be noted that the following detailed descriptions are merely exemplary and are intended to provide further descriptions of the present disclosure. Unless otherwise indicated, all technical and scientific terms used in the present disclosure have the same meaning as commonly understood by a person of ordinary skill in the art to which the present disclosure pertains.

It should be noted that the terminology used herein is merely for describing the specific embodiments and is not intended to limit the exemplary embodiments according to the present disclosure. As used herein, unless the context clearly dictates otherwise, the singular forms are intended to include the plural forms. Furthermore, it should also be understood that when the terms 'comprising' and/or 'including' are used in the present disclosure, they specify the presence of features, steps, operations, devices, components, and/or combinations thereof.

Figure 1:
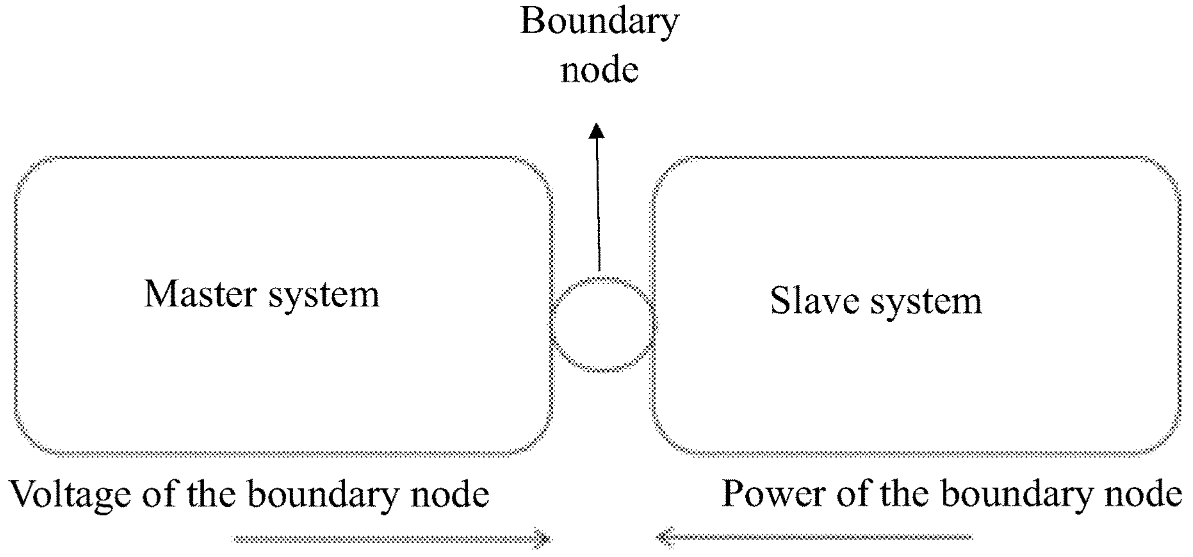
FIG. 1 is a schematic diagram illustrating a power system divided into a master system and a slave system according to some embodiments of the present disclosure.
Figure 2:
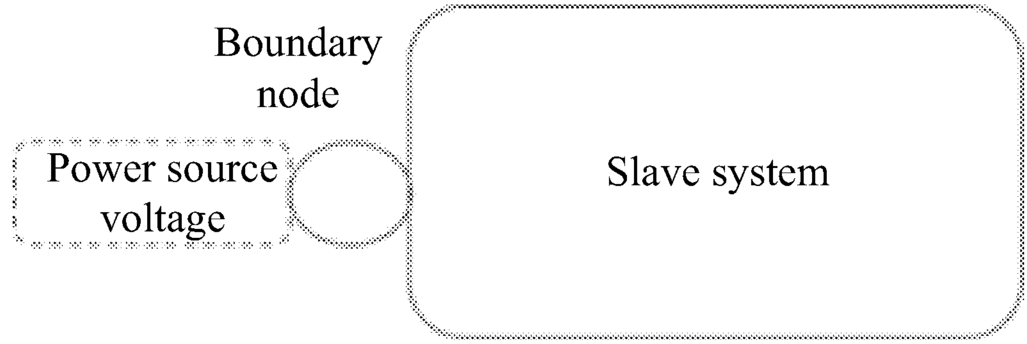
FIG. 2 is a schematic diagram of a simplified master system according to some embodiments of the present disclosure.
Figure 3:
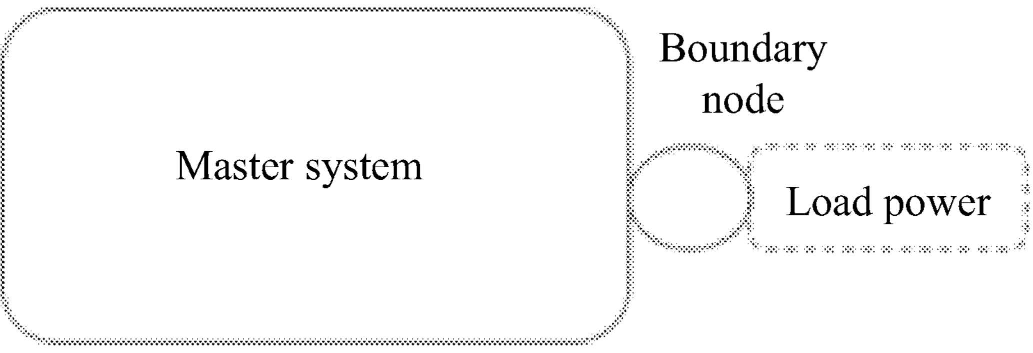
FIG. 3 is a schematic diagram illustrating a simplified slave system according to some embodiments of the present disclosure.
Figure 4:
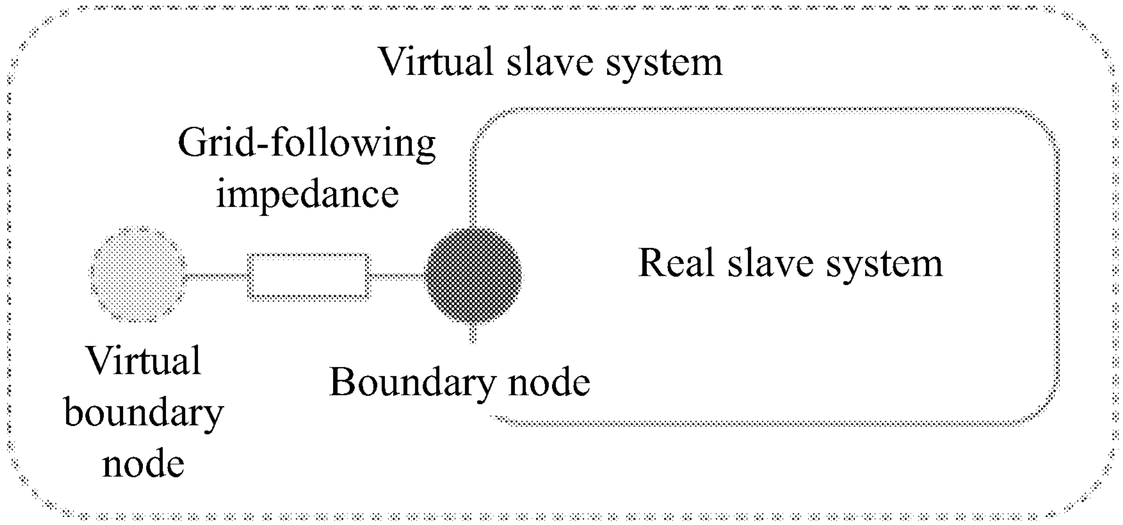
FIG. 4 is a schematic diagram illustrating an exemplary simplified slave system according to some embodiments of the present disclosure.

FIG. 1 is a schematic diagram illustrating a power system divided into a master system and a slave system according to some embodiments of the present disclosure; FIG. 2 is a schematic diagram illustrating a simplified master system according to some embodiments of the present disclosure; FIG. 3 is a schematic diagram illustrating a simplified slave system according to some embodiments of the present disclosure; FIG. 4 is a schematic diagram illustrating an exemplary simplified slave system according to some embodiments of the present disclosure; and FIG. 5 is a flowchart illustrating an exemplary method for joint power flow calculation of master-slave systems based on grid-following impedance according to some embodiments of the present disclosure. As shown in FIG. 5, the flow 500 includes steps S1-S6. In some embodiments, the flow 500 may be executed by a processor.

The processor can process data and/or information from a power system and/or an external data source. The processor can execute program instructions based on the data, information and/or processing results, thereby performing one or more functions described in the present disclosure. For example, the processor may execute the flow 500 in FIG. 5. In some embodiments, the processor may be a combination of one or more of a microcontroller (MCU), an embedded processor, a graphics processing unit (GPU), or the like.

Step S1: dividing a power system into a master system and at least one slave system, and determining a boundary node; adding a virtual slack node in the at least one slave system, and setting grid-following impedance between the virtual slack node and the boundary node to constitute a virtual slave system.

The master system refers to a power grid configured to be responsible for large-capacity, long-distance electric energy transmission.

The slave system refers to a power grid configured to be responsible for distributing electric energy to users.

The boundary node refers to the physical connection point of the master system and the slave system.

In some embodiments, each slave system is connected to the master system through a boundary node, and if there exists a plurality of slave systems, a plurality of boundary nodes are correspondingly provided.

In some embodiments, as shown in FIG. 1, FIG. 2, and FIG. 3, the processor may divide the power system into the master system and the at least one slave system, and determine the physical connection point between the master system and the at least one slave system as the boundary node.

The slack node refers to a node that has a constant voltage magnitude and a phase angle, and is configured to balance a power difference of the system.

The virtual slack node refers to an artificially added electrical node that is used as a slack node in the power flow calculation of the virtual slave system.

The slack node and the added virtual slack node are different concepts. The former belongs to the master system and is used for the power flow calculation within the master system, while the latter belongs to the virtual slave system and is used for the power flow calculation of the virtual slave system, and the two do not interfere with each other.

The grid-following impedance refers to a virtual circuit element with a variable impedance value that is set between the virtual slack node and the boundary node. The resistance value and the reactance value of the grid-following impedance are dynamically determined according to the elements of the inverse Jacobian matrix calculated based on the power flow of the master system, and are configured to simulate a coupling relationship between the master-slave systems by the influence of the slave system power on the voltage of the boundary node during the power flow calculation of the slave system, thereby causing the power flow calculation results of the slave system to be closer to a real value.

The virtual slave system refers to an equivalent calculation model constituted after adding a virtual slack node based on the slave system and setting grid-following impedance between the virtual slack node and the boundary node. The virtual slave system is configured to replace the slave system for power flow calculation, so as to reflect a voltage-power coupling influence of the master system on the slave system during the calculation process. In the present disclosure, the slave system refers to a physically existing real slave system, which is distinguished from the virtual slave system after adding the grid-following impedance.

Step S2: setting the voltage of the boundary node as the initial value, calculating power flow of the at least one slave system, and obtaining the slave system power of the boundary node.

The initial value refers to a preset voltage value that is assigned to the voltage of the boundary node before starting the iterative calculation.

In some embodiments, the initial value of the voltage of the boundary node is a rated voltage.

The rated voltage is close to a voltage level of the power system during normal operation. Adopting the rated voltage as the initial value of the voltage of the boundary node allows the iterative calculation to start from a more reasonable starting point, facilitating reducing the iterations and accelerating the convergence speed.

The slave system power refers to active power and reactive power that is measured at the boundary node and injected into the slave system by the master system. The slave system power only includes power flowing into actual loads within the slave system, and does not include power loss on the grid-following impedance.

The power flow refers to a distribution state of voltage magnitudes and phase angles of various nodes and active power and reactive power of various branches in a power system.

In some embodiments, after setting the voltage of the boundary node as the initial value, the processor performs power flow calculation for an internal network of the slave system, and according to the power flow calculation results, obtains the slave system power at the boundary node. In this step, what is calculated is the slave system without added grid-following impedance, that is, a real slave system.

Adopting the rated voltage as the initial value of the voltage of the boundary node: on one hand, the rated voltage is close to the actual operating voltage, thereby allowing the iterative calculation to start from a more reasonable starting point and preventing an increase in the count of iterations caused by an excessive deviation of the initial value; on the other hand, during actual operation of the power system, the voltage of the boundary node is usually maintained near the rated voltage, and taking the rated voltage as the initial value conforms to physical reality, which facilitates accelerating the convergence speed and improving the efficiency of the joint power flow calculation.

Step S3: setting the power of the boundary node as the slave system power, calculating the power flow of the master system, obtaining the voltage of the boundary node and a corresponding element between a voltage magnitude correction value of the boundary node and an active power imbalance of the boundary node, and a corresponding element between the voltage magnitude correction value of the boundary node and a reactive power imbalance of the boundary node in an inverse Jacobian matrix calculated based on the power flow of the master system.

The Jacobian matrix refers to a square matrix configured to describe a partial derivative relationship between a node power imbalance and a node voltage magnitude correction value in the power flow calculation of the Newton-Raphson manner. The inverse Jacobian matrix refers to an inverse matrix of the Jacobian matrix, the elements of which reflect sensitivity of node power variation to node voltage.

In power flow calculation of a power system, nodes are usually divided into three types: a PQ node (Active-Reactive power Node), a PV (Active power-Voltage Node) node, and a slack node. The PQ node refers to a node for which active power and reactive power are given, and for which a voltage magnitude and a phase angle are to be determined. The PV node refers to a node for which active power and a voltage magnitude are given, and for which reactive power and a phase angle are to be determined. The slack node refers to a node for which a voltage magnitude and a phase angle are given, and for which active power and reactive power are to be determined, and is configured to balance the power difference of the entire system.

In some embodiments, the boundary node in step S3 is a PQ node, and the virtual slack node in step S5 is a slack node. More descriptions regarding the virtual slack node being a slack node may be found elsewhere in the present disclosure (e.g., step S5 and related descriptions thereof).

The reason for processing the boundary node as a PQ node is that the slave system power has been obtained through step S2, and the slave system power may be considered as known injected power at the boundary node, which conforms to the definition of a PQ node.

The present embodiment, setting the boundary node in step S3 as a PQ node and setting the virtual slack node in step S5 as a slack node causes the node type configuration of the power flow calculation of the master system and the power flow calculation of the virtual slave system to match actual physical roles, ensures logical consistency of transmission of boundary electrical quantities during the alternating iteration process of the master-slave systems, and facilitates improving the convergence stability of the joint power flow calculation.

In some embodiments, the power flow calculation of the master system employs the Newton-Raphson manner. The Newton-Raphson manner is a numerical method for solving a system of nonlinear equations through successive linearization iteration, having the characteristics of fast convergence speed and high accuracy, and is suitable for power flow calculation of large-scale power systems such as a transmission network.

In some embodiments, the processor may set the power of the boundary node as the slave system power, and calculate the power flow of the master system according to the Newton-Raphson manner. A correction equation for power flow calculation of the master system may be expressed as the following Formula (1):

$$\begin{bmatrix} \Delta P \\ \Delta Q \end{bmatrix} = J \begin{bmatrix} \Delta\theta \\ \Delta V \end{bmatrix} \tag{1}$$

In Formula (1), ΔP refers to a column vector of active power imbalances of all nodes (including all PQ nodes and PV nodes) of the master system except for the slack node, ΔQ refers to a column vector of reactive power imbalances of all PQ nodes of the master system, J refers to the Jacobian matrix, Δθ refers to a column vector of phase angle correction values of all nodes of the master system except for the slack node, and ΔV refers to a column vector of voltage magnitude correction values of all PQ nodes of the master system. The voltage magnitude and phase angle of the slack node are given values, and do not participate in the foregoing correction process.

The active power imbalance refers to a difference between active power injected by a boundary node and active power consumed by a node.

The reactive power imbalance refers to a difference between reactive power injected by a boundary node and reactive power consumed by a node.

In some embodiments, by multiplying both sides of Formula (1) by an inverse matrix of the Jacobian matrix on the left simultaneously, the following transformed form may be obtained:

$$\begin{bmatrix} \Delta\theta \\ \Delta V \end{bmatrix} = J^{-1} \begin{bmatrix} \Delta P \\ \Delta Q \end{bmatrix} \tag{2}$$

In Formula (2), $J^{-1}$ denotes the inverse Jacobian matrix.

As can be seen from the foregoing Formula (2), a relationship regarding an influence of power variation of the boundary node on voltage variation of the boundary node in the master system may be expressed as the following Formula (3):

$$\Delta V_B = J_{i,j}^{-1} \Delta P_B + J_{i,k}^{-1} \Delta Q_B \tag{3}$$

In Formula (3), the subscript B denotes the boundary node; $\Delta V_B$ refers to the voltage magnitude correction value of the boundary node, $\Delta P_B$ refers to the active power imbalance of the boundary node, and $\Delta Q_B$ refers to the reactive power imbalance of the boundary node. i refers to an index of the voltage magnitude correction value of the boundary node in the $$\begin{bmatrix} \Delta\theta \\ \Delta V \end{bmatrix}$$

vector, j refers to an index of the active power imbalance of the boundary node in the $$\begin{bmatrix} \Delta P \\ \Delta Q \end{bmatrix}$$

vector, and k refers to an index of the reactive power imbalance of the boundary node in the $$\begin{bmatrix} \Delta P \\ \Delta Q \end{bmatrix}$$

vector.

$$J_{i,j}^{-1}$$

refers to a corresponding element between the voltage magnitude correction value of the boundary node and the active power imbalance of the boundary node in the inverse Jacobian matrix, $$J_{i,k}^{-1}$$

refers to a corresponding element between the voltage magnitude correction value of the boundary node and the reactive power imbalance of the boundary node in the inverse Jacobian matrix. i refers to the ith row of the inverse Jacobian matrix, and j and k refer to the jth column and the kth column of the inverse Jacobian matrix, respectively.

In some embodiments the processor may obtain the voltage $V_B$ of the boundary node, and elements $$J_{i,j}^{-1}$$

and $$J_{i,k}^{-1}$$

of the inverse Jacobian matrix based on calculation results of the power flow of the master system.

$$J_{i,j}^{-1}$$

reflects a sensitivity of active power variation of the boundary node to the voltage magnitude of the boundary node, and $$J_{i,k}^{-1}$$

reflects a sensitivity of reactive power variation of the boundary node to the voltage magnitude of the boundary node. These two pieces of sensitivity information are used in subsequent steps for calculating the grid-following impedance to simulate a voltage-power coupling relationship between the master system and the slave system.

Step S4: calculating a resistance value and a reactance value of the grid-following impedance, and calculating a voltage of the virtual slack node according to the corresponding elements of the inverse Jacobian matrix, the voltage of the boundary node, and the slave system power.

In some embodiments, according to circuit principles, in the virtual slave system, a voltage drop between the virtual slack node and the boundary node may be approximately expressed as a longitudinal component form, as shown in Formula (4):

$$V_C - V_B \approx \frac{P_B R_D + Q_B X_D}{V_B} \tag{4}$$

In Formula (4), $V_C$ refers to the voltage of the virtual slack node, $V_B$ refers to the voltage of the boundary node, $P_B$ refers to the active power of the boundary node, $Q_B$ refers to the reactive power of the boundary node, $R_D$ refers to the resistance value of the grid-following impedance, and $X_D$ refers to the reactance value of the grid-following impedance.

In some embodiments, the resistance value of the grid-following impedance is determined by multiplying the voltage of the boundary node by the corresponding element between the voltage magnitude correction value of the boundary node and the active power imbalance of the boundary node in the inverse Jacobian matrix; and the reactance value of the grid-following impedance is determined by multiplying the voltage of the boundary node by the corresponding element between the voltage magnitude correction value of the boundary node and the reactive power imbalance of the boundary node in the inverse Jacobian matrix. Combining Formula (3) and Formula (4), the processor may determine the resistance value and the reactance value of the grid-following impedance, respectively, as follows:

$$R_D = J_{i,j}^{-1} V_B$$

$$X_D = J_{i,k}^{-1} V_B$$

Further, considering both the transverse component and the longitudinal component of the voltage drop, an accurate calculation formula for the voltage $V_C$ of the virtual slack node is:

$$V_C = \sqrt{\left(V_B + \frac{P_B R_D + Q_B X_D}{V_B}\right)^2 + \left(\frac{P_B X_D - Q_B R_D}{V_B}\right)^2} \tag{5}$$

More descriptions regarding parameters in Formula (5) may be found elsewhere in the present disclosure (e.g., Formula (4) and related descriptions thereof).

Compared with the approximate Formula (4) which only considers the longitudinal component of the voltage drop, employing Formula (5) to calculate the voltage of the virtual slack node, which simultaneously considers the transverse component and the longitudinal component of the voltage drop, can more accurately reflect a voltage relationship between the virtual slack node and the boundary node, thereby causing calculation results of the power flow of the virtual slave system to be more accurate, and facilitating further improvement of stability of overall iterative convergence.

Step S5: calculating power flow of the virtual slave system based on the grid-following impedance and the voltage of the virtual slack node, and obtaining new slave system power from the boundary node.

In some embodiments, the processor, after constituting the virtual slave system, sets the virtual slack node as a slack node, and takes the voltage $V_C$ of the virtual slack node as a reference voltage to calculate power flow of the virtual slave system.

In some embodiments, the power flow calculation of the virtual slave system may employ a forward-backward sweep manner or the Newton-Raphson manner.

In some embodiments of the present disclosure, the master system employs the Newton-Raphson manner to leverage its advantages of fast convergence and high accuracy in the transmission network. The slave system employs the forward-backward sweep manner or the Newton-Raphson manner, which may flexibly adapt to a radial or a ring distribution network structure, taking into account both calculation efficiency and adaptability, thereby enhancing overall performance of the master-slave joint power flow calculation.

In some embodiments, in the calculation of the power flow of the virtual slave system in step S5, power loss on the grid-following impedance is not included in the slave system power. That is, the slave system power $P_B$ and $Q_B$ obtained at the boundary node only include power flowing into an actual load inside the slave system, and do not include power loss on a branch of the grid-following impedance. This processing ensures a true physical meaning of the slave system power, thereby allowing judgment of iterative convergence to be more accurate.

Step S6: determining whether the voltage of the boundary node, the active power of the boundary node, and the reactive power of the boundary node satisfy a convergence condition, and in response to determining that the convergence condition is satisfied, ending the calculation; or in response to determining that the convergence condition is not satisfied, returning to step S3 to continue iteration.

In some embodiments, the convergence condition in step S6 includes: in a current iteration, differences between calculation results of the voltage of the boundary node, the active power of the slave system, and the reactive power of the slave system and calculation results of a previous iteration are all less than a preset error threshold, or a count of iterations exceeds a preset upper limit.

For a first iteration, since no calculation result of a previous iteration exists, the processor may directly skip the convergence determination, take the voltage of the boundary node obtained by the first iteration as a known quantity, and directly return to step S3 to perform a second iteration calculation. Alternatively, the processor may preset an initial value of a calculation result of the previous iteration as infinity or a value much greater than the preset error threshold, to ensure that the first iteration will not incorrectly converge due to a difference condition.

The preset error threshold may be set according to calculation accuracy requirements. For example, the active power error threshold may be set to 0.001 MW, the reactive power error threshold may be set to 0.001 MVar, and the voltage error threshold may be set to 0.0001 pu. The preset upper limit may be set according to calculation efficiency requirements. For example, it may be set to 50 iterations. When the foregoing physical quantities of all of the boundary nodes all satisfy the convergence condition, the joint power flow calculation of the master-slave systems is considered to have reached convergence, and an iteration process may be ended.

It can be understood that, since the boundary node is the only physical connection point between the master system and the slave system, in electrical measurement, the voltage $V_B$ of the boundary node refers to the voltage at an interface between the slave system and the master system. The active power $P_B$ and the reactive power $Q_B$ injected by the master system at the boundary node refer to the active power and the reactive power flowing into the slave system, which are also the slave system power defined in the present disclosure. Therefore, during the iteration process, the voltage $V_B$ of the boundary node, the active power $P_B$, and the reactive power $Q_B$ are numerically consistent with electrical quantities of a corresponding port of the slave system (i.e., the voltage at the interface between the slave system and the master system, the active power of the slave system, and the reactive power of the slave system).

In some embodiments, after each iteration is completed, the processor determines whether differences between $V_B$, $P_B$, and $Q_B$ obtained by the current iteration and calculated values of the previous iteration are all less than the preset error threshold. If yes, the processor outputs the current calculation results as a final power flow solution. If no, the processor returns $V_B$ obtained by the current iteration to step S3 to initiate a new iteration calculation.

In some embodiments of the present disclosure, by adding the virtual grid-following impedance in the power flow calculation of the slave system, and dynamically determining a value of the grid-following impedance based on elements of the inverse Jacobian matrix of the master system, a coupling influence of the master system on voltage-power of the boundary node is simulated when the slave system is calculated independently. Compared with a traditional manner of master-slave joint power flow calculation where the master system and the slave system are completely separated and interact only through electrical quantities of boundary nodes, the method for joint power flow calculation of master-slave systems based on grid-following impedance causes calculation results of the power flow of the slave system to be closer to a true value, effectively reduces counts of iterations between the master system and the slave system, and significantly improves efficiency of the joint power flow calculation.

In some embodiments, the master system is the transmission network, the slave system is the distribution network, and the boundary node is a low-voltage busbar of a substation.

It can be understood that the low-voltage busbar of the substation, as an electrical connection point between the transmission network and the distribution network, may be equivalently regarded as an electrical node in circuit topology, namely the boundary node.

In some embodiments, the slack node of the master system may be a main frequency regulation power plant busbar in the transmission network. The main frequency regulation power plant busbar, as a reference node for power flow calculation of the master system, has its voltage magnitude and phase angle kept constant, and is used for balancing active power and reactive power differences within the master system. In terms of electrical topology, it may be equivalently regarded as a slack node.

In some embodiments, the at least one slave system includes a plurality of slave systems, each of the plurality of slave systems is calculated independently, and the master system coordinates iteration uniformly.

In some embodiments, when the power system includes a plurality of distribution networks, each distribution network may be taken as a slave system, and each slave system has its own boundary node with the master system. In each iteration, each slave system, based on the current voltage value of each of its boundary nodes, independently completes its internal power flow calculation, thereby obtaining its slave system power; the master system collects the slave system power at all the boundary nodes, performs power flow calculation in a unified manner, updates the voltage values of the boundary nodes, and uses the updated voltage values for the next iteration. The slave systems do not need to directly interact with each other, but are only indirectly coordinated by the master system, until all the boundary nodes satisfy the convergence condition.

The architecture of 'master system unified coordination and slave system parallel calculation' in the present disclosure fully utilizes the physical hierarchical characteristics of the master-slave systems, which is beneficial for improving the efficiency of joint power flow calculation in scenarios with large-scale distribution network connections.

In some embodiments, the grid-following impedance is dynamically updated after each calculation of the power flow of the master system.

Specifically, after completing step S3 of each iteration, the processor, based on the latest corresponding elements $$J_{i,j}^{-1}$$

and $$J_{i,k}^{-1}$$

of the inverse Jacobian matrix obtained from the current power flow calculation of the master system, and the updated voltage of the boundary node $V_B$, recalculates the resistance value $R_D$ and the reactance value $X_D$ of the grid-following impedance. Since the inverse Jacobian matrix elements change with the operating state of the system, the value of the grid-following impedance also dynamically adjusts accordingly, thereby tracking changes in the voltage-power coupling relationship between the master system and the slave system in real time, and ensuring the accuracy of the power flow calculation of the virtual slave system. More descriptions regarding the calculation of the power flow of the master system may be found elsewhere in the present disclosure (e.g., step S3 and related descriptions thereof).

In some embodiments, as shown in FIG. 4, the processor adds a virtual slack node in the slave system, and sets grid-following impedance between the virtual slack node and the boundary node, to constitute the virtual slave system. In FIG. 4, the virtual slack node serves as a slack node of the virtual slave system, the voltage magnitude and phase angle of which are determined by calculation in step S4; the boundary node no longer serves as a slack node in the virtual slave system, but serves as an end node of the grid-following impedance branch. The virtual slave system is configured to perform power flow calculation in step S5, replacing the slave system, to reflect the voltage-power coupling impact of the master system on the slave system during the calculation.

This embodiment, by dynamically updating the grid-following impedance after each power flow calculation of the master system, allows the value of the grid-following impedance to adjust in real time with changes in the operating state of the system, accurately reflecting the voltage support strength of the master system to the slave system under current operating conditions, thereby ensuring the accuracy of the power flow calculation of the virtual slave system, and further improving the convergence speed and stability of the master-slave joint iteration.

According to some embodiments of the present disclosure, a system for joint power flow calculation of master-slave systems based on grid-following impedance is provided. The system includes: a system partition module, configured to: divide a power system into a master system and a slave system, and determine a boundary node; add a virtual slack node in the slave system, and set grid-following impedance between the virtual slack node and the boundary node to constitute a virtual slave system; an initial value calculation module, configured to: set the voltage of the boundary node as the initial value, calculate power flow of the slave system, and obtain slave system power of the boundary node; a master system calculation module, configured to: set the power of the boundary node as the slave system power, calculate power flow of the master system, obtain the voltage of the boundary node, a corresponding element between the voltage magnitude correction value of the boundary node and the active power imbalance of the boundary node, and a corresponding element between the voltage magnitude correction value of the boundary node and the reactive power imbalance of the boundary node in an inverse Jacobian matrix calculated based on the power flow of the master system; an impedance determination module, configured to: according to the corresponding elements of the inverse Jacobian matrix, the voltage of the boundary node, and the slave system power, calculate the resistance value and the reactance value of the grid-following impedance, and calculate the voltage of the virtual slack node; a virtual power flow module, configured to: calculate power flow of the virtual slave system based on the grid-following impedance and the voltage of the virtual slack node, and obtain the new slave system power from the boundary node; a convergence determination module, configured to: determine whether the voltage of the boundary node, the active power of the boundary node, and the reactive power of the boundary node satisfy the convergence condition, and in response to determining that the convergence condition is satisfied, end the calculation; otherwise return to step S3 to continue iteration; wherein the resistance value of the grid-following impedance is determined by multiplying the voltage of the boundary node by the corresponding element between the voltage magnitude correction value of the boundary node and the active power imbalance of the boundary node in the inverse Jacobian matrix; and the reactance value of the grid-following impedance is determined by multiplying the voltage of the boundary node by the corresponding element between the voltage magnitude correction value of the boundary node and the reactive power imbalance of the boundary node in the inverse Jacobian matrix.

In some embodiments, after determining that the voltage of the boundary node, the active power of the boundary node, and the reactive power of the boundary node satisfy the convergence condition in step S6, the method further includes: generating a voltage support state variable of the boundary node based on the grid-following impedance, and the voltage of the boundary node, the active power of the boundary node, and the reactive power of the boundary node when the convergence condition is satisfied; determining a voltage regulation mode of the boundary node based on the voltage support state variable; and according to the voltage regulation mode of the boundary node, controlling a circuit breaker operating mechanism to perform mechanical closing and opening, to physically connect or disconnect a shunt capacitor bank or a reactor to or from the power grid.

The voltage support state variable refers to a multidimensional index set used for comprehensively evaluating the voltage support condition of the boundary node, which reflects the voltage support strength of the master system to the boundary node, the stability of the current voltage of the boundary node, and the dynamic change trend of the support state. In some embodiments, the voltage support state variable may include a grid-following impedance modulus, a voltage deviation amount of the boundary node, a change rate of the grid-following impedance, or the like.

The grid-following impedance modulus refers to the magnitude of the grid-following impedance, configured to quantify an equivalent electrical distance between the master system and the boundary node. The larger the grid-following impedance modulus, the further the electrical distance of the master system to the boundary node, or the larger the system impedance, meaning that the voltage support capability of the master system to the boundary node is weaker.

In some embodiments, the processor may determine the square root of the sum of squares of the resistance value and the reactance value of the grid-following impedance as the grid-following impedance modulus, as shown in Formula (6):

$$Z_m = \sqrt{R_D^2 + X_D^2} \tag{6}$$

In Formula (6), $Z_m$ is the grid-following impedance modulus, $R_D$ is the resistance value of the grid-following impedance, and $X_D$ is the reactance value of the grid-following impedance.

The voltage deviation amount of the boundary node refers to the degree of difference between the current voltage of the boundary node and a target voltage, configured to quantify the voltage offset condition of the boundary node.

In some embodiments, the processor may determine the difference between the target voltage and the voltage of the boundary node as the voltage deviation amount of the boundary node, as shown in Formula (7):

$$\Delta V = V_{ref} - V_B \tag{7}$$

In Formula (7), $\Delta V$ is the voltage deviation amount of the boundary node, $V_{ref}$ is the target voltage, and $V_B$ is the voltage of the boundary node.

The target voltage refers to a rated operating voltage value that the boundary node is expected to maintain, which may typically be the rated voltage of the boundary node or a voltage command value issued by a dispatch department.

In some embodiments, when the voltage deviation amount of the boundary node $\Delta V>0$, it indicates that the boundary node is in the undervoltage state; and when $\Delta V<0$, it indicates that the boundary node is in the overvoltage state.

The change rate of the grid-following impedance refers to the change amount of the grid-following impedance modulus between two adjacent iterations, configured to quantify the fluctuation degree of the voltage support strength of the master system to the boundary node. The larger the change rate of the grid-following impedance, the more violent the fluctuation of the external support state of the boundary node.

In some embodiments, the processor may determine the absolute value of the difference between the grid-following impedance modulus of the current iteration and the previous iteration as the change rate of the grid-following impedance, as shown in Formula (8):

$$F_Z = Z_m^t - Z_m^{t-1} \tag{8}$$

In Formula (8), $F_Z$ is the change rate of the grid-following impedance, $$Z_m^t$$

is the grid-following impedance modulus obtained from the current iteration calculation, and $$Z_m^{t-1}$$

is the grid-following impedance modulus obtained from the previous iteration calculation.

In some embodiments, the processor may combine the grid-following impedance modulus, the voltage deviation amount of the boundary node, and the change rate of the grid-following impedance into a vector or a data packet format to generate the voltage support state variable. For example, the voltage support state variable may be expressed as: ['Grid-following impedance modulus: 0.206Ω', 'Voltage deviation amount: +0.2 kV', 'Change rate of grid-following impedance: 0.01 Ω/iteration'].

The voltage regulation mode refers to a type of control strategy determined based on the voltage support state variable, configured to regulate the voltage of the boundary node. In some embodiments, the voltage regulation mode may include a weak support undervoltage compensation mode, a weak support overvoltage suppression mode, and a fluctuation suppression mode.

The weak support undervoltage compensation mode refers to a control strategy for compensating reactive power at the boundary node to boost the voltage when the master system provides weak support to the boundary node and the boundary node is in the undervoltage state. In some embodiments, when the grid-following impedance modulus is greater than a preset modulus threshold (indicating that the master system provides weak support to the boundary node), and the voltage deviation amount of the boundary node is greater than 0 (indicating that the boundary node is in the undervoltage state), and when a reactive power demand indicator indicates that there is a reactive power compensation demand, the processor may set the voltage regulation mode to the weak support undervoltage compensation mode. The preset modulus threshold may be determined based on empirical preset values.

The reactive power demand indicator refers to an indicator configured to determine whether the boundary node needs to connect or disconnect a reactive power compensation device. In some embodiments, the reactive power demand indicator may be a comparison result between the reactive power $Q_B$ of the boundary node and a preset reactive power threshold, or the current output margin of a Static Var Generator (SVG). For example, when $Q_B$ is greater than the preset reactive power threshold, or when the SVG output has reached its capacitive compensation upper limit, it is determined that there is a reactive power compensation demand.

The weak support overvoltage suppression mode refers to a control strategy for absorbing reactive power at the boundary node to reduce the voltage when the master system provides weak support to the boundary node and the boundary node is in the overvoltage state. In some embodiments, when the grid-following impedance modulus is greater than the preset modulus threshold (indicating that the master system provides weak support to the boundary node), and the voltage deviation amount of the boundary node is less than 0 (indicating that the boundary node is in the overvoltage state), and when the reactive power demand indicator indicates that there is a reactive power suppression demand, the processor may set the voltage regulation mode to the weak support overvoltage suppression mode.

The fluctuation suppression mode refers to a control strategy for suppressing frequent actions of reactive power compensation devices when the voltage support state of the master system to the boundary node changes violently. In some embodiments, when the change rate of the grid-following impedance is greater than a change rate threshold (indicating a violent change in the voltage support state), the processor may set the voltage regulation mode to the fluctuation suppression mode. The change rate threshold may be determined based on empirical preset values.

The circuit breaker operating mechanism refers to a mechanism inside the circuit breaker configured to control closing and opening, which is composed of a plurality of mechanical transmission components. For example, springs, connecting rods, or the like.

In some embodiments, the processor may, according to the voltage regulation mode of the boundary node, send a control instruction to the circuit breaker operating mechanism, driving the mechanical transmission components inside the circuit breaker to displace (e.g., releasing a stored closing spring), thereby causing a main contact of the circuit breaker to physically close or separate, to complete mechanical closing and opening, to physically connect or disconnect the shunt capacitor bank or the reactor to or from the power grid.

For example, in the weak support undervoltage compensation mode, when it is monitored that the reactive power output by the SVG has reached the output upper limit of the SVG, and the duration of the boundary node being in the undervoltage state exceeds a preset time threshold, the processor controls the circuit breaker of the shunt capacitor bank to perform a closing operation, to connect the shunt capacitor bank to the power grid to provide additional reactive power compensation. The output upper limit of the SVG may be determined by querying rated parameters of the device, and the preset time threshold may be determined based on empirical preset values.

Further, for example, in the weak support overvoltage suppression mode, when it is monitored that the reactive power absorbed by the SVG has reached the output upper limit of the SVG, and the duration of the boundary node being in the overvoltage state exceeds the preset time threshold, the processor controls the circuit breaker of the engaged shunt capacitor bank to perform an opening operation, or controls the circuit breaker of the reactor to perform a closing operation, to reduce the capacitive reactive power or increase the inductive reactive power of the system, thereby suppressing a voltage rise.

For example, in the fluctuation suppression mode, the processor may prohibit the circuit breaker from performing any mechanical closing and opening, thereby preventing frequent operations of the circuit breaker and damage.

In some embodiments of the present disclosure, by constructing a multi-dimensional voltage support state variable including the modulus value and the change rate of the grid-following impedance, blind control solely based on the single voltage deviation is avoided. This allows for a full assessment of a true support strength of an external power grid for the boundary node and a severity of dynamic changes, thereby enabling precise determination of the optimal voltage regulation mode for the boundary node. According to this tiered scheduling of the SVG (for fast continuous fine-tuning) and mechanical switches (for discrete large-capacity coarse-tuning), misregulation and repeated oscillations for the boundary node may be effectively avoided during severe fluctuations of the external power grid. This ensures both the safety and the stability of the voltage of the boundary node, and prevents mechanical equipment within the substation from being damaged due to frequent operations.

In some embodiments, after calculating the inverse Jacobian matrix in step S3, the method further includes: calculating a condition number of a Jacobian matrix of the inverse Jacobian matrix; in response to the condition number being not less than a preset condition threshold, obtaining a pseudoinverse matrix of the Jacobian matrix; extracting a target element from the pseudoinverse matrix, updating the corresponding elements in the inverse Jacobian matrix according to the target element to obtain updated corresponding elements, and using the updated corresponding elements of the inverse Jacobian matrix to participate in the calculation of step S4.

The condition number refers to a mathematical indicator for measuring the ill-conditioned degree of the Jacobian matrix. The larger the numerical value of the condition number, the closer the Jacobian matrix is to singularity. At this time, in a matrix inversion process, a minor perturbation of input data may cause a sharp amplification of values of inverse matrix elements, thereby leading to instability of calculation results or even numerical overflow.

The ill-conditioned state refers to a state where the Jacobian matrix is close to singularity and is irreversible. For example, when the power system operates near a voltage stability limit, the condition number of the Jacobian matrix may reach above $10^8$. At this time, direct inversion may lead to severe numerical instability.

In some embodiments, the processor may extract the current Jacobian matrix, calculate a ratio of a maximum singular value of the Jacobian matrix to a minimum singular value of the Jacobian matrix, and determine the ratio as the condition number.

The preset condition threshold refers to a numerical boundary configured to determine whether the Jacobian matrix falls into the ill-conditioned state and requires an alternative inversion strategy.

In some embodiments, the preset condition threshold may be determined based on a preset value, for example, 1000.

There are two known situations: where the condition number is not less than the preset condition threshold, and where the condition number is less than the preset condition threshold. When the condition number is less than the preset condition threshold, the Jacobian matrix is considered to be in a good state, and direct inversion may be performed. When the condition number is not less than the preset condition threshold, the Jacobian matrix is considered to be in the ill-conditioned state, and a pseudoinverse matrix needs to be used to replace direct inversion.

The pseudoinverse matrix refers to an alternative matrix that is obtained by introducing a regularization manner when an original matrix is ill-conditioned or singular and a standard inverse matrix cannot be stably obtained, and that can both approximately reflect a physical inverse relationship of the original matrix and ensure numerical stability.

In some embodiments, the processor may obtain the pseudoinverse matrix by performing an inversion operation after applying a numerical damping on the basis of the original matrix. The numerical damping refers to a preset correction parameter used to improve numerical conditions of the matrix and prevent numerical divergence during the inversion process.

The target element refers to a numerical value extracted from the pseudoinverse matrix and configured to replace corresponding elements in the inverse Jacobian matrix. For example, the target element may be the corresponding element between the voltage magnitude correction value of the boundary node and the active power imbalance of the boundary node, and the corresponding element between the voltage magnitude correction value of the boundary node and the reactive power imbalance of the boundary node, in the pseudoinverse matrix.

The target element characterizes the sensitivity information that, under an ill-conditioned state of the Jacobian matrix, reflects the degree of influence of power changes of the boundary node on its voltage magnitude.

In some embodiments, the processor may, based on row and column positions of the corresponding elements $$J_{i,j}^{-1}$$

and $$J_{i,k}^{-1}$$

in the inverse Jacobian matrix, extract elements at the same positions in the pseudoinverse matrix as the target elements, and update the corresponding elements $$J_{i,j}^{-1}$$

and $$J_{i,k}^{-1}$$

of the inverse Jacobian matrix according to the target elements, and use the updated corresponding elements of the inverse Jacobian matrix to participate in the calculation of the resistance value and the reactance value of the grid-following impedance in step S4.

In the embodiments of the present disclosure, for complex and harsh operating conditions such as extreme heavy load of a power grid or approaching a stability limit, a health dynamic monitoring and abnormal branch routing mechanism for an underlying solution matrix is added. This mechanism successfully intercepts forced direct inversion when the matrix becomes ill-conditioned and singular, thereby avoiding parameter numerical explosion, gradient runaway, and underlying solution program crash deadlock caused thereby. This greatly improves the pressure resistance and the robustness of the overall master-slave joint power flow calculation model, and ensures that the program can seamlessly cover complex extreme operating environments of the full-range physical power grid.

In some embodiments, the obtaining the pseudoinverse matrix of the Jacobian matrix includes: determining a dynamic damping factor based on the active power imbalance of the boundary node and the reactive power imbalance of the boundary node; determining a correction matrix based on the Jacobian matrix, a transpose matrix of the Jacobian matrix, and the dynamic damping factor; determining the pseudoinverse matrix based on the correction matrix and the transpose matrix of the Jacobian matrix.

More descriptions regarding the active power imbalance and the reactive power imbalance may be found elsewhere in the present disclosure (e.g., step S3 and related descriptions thereof).

The dynamic damping factor refers to a positive definite parameter that is added to a main diagonal of a matrix in a regularization process to improve the numerical conditions of the matrix.

In some embodiments, the magnitude of the dynamic damping factor can be adaptively adjusted based on a magnitude of an imbalance of a current power flow calculation of the power system. When a system state fluctuates severely and the imbalance is relatively large, the dynamic damping factor takes a larger value to provide the sufficient numerical damping. When the system tends to be stable and the imbalance gradually decreases, the dynamic damping factor automatically decays to a smaller value to avoid an adverse effect on the final calculation accuracy. For example, when the power grid oscillates severely, the dynamic damping factor takes 0.01. When the power grid gradually becomes stable, the dynamic damping factor automatically decays to 0.00001.

In some embodiments, the processor may calculate an L2 norm of the active power imbalance of the boundary node and the reactive power imbalance of the boundary node, and based on the obtained L2 norm, query a damping preset table, thereby obtaining the dynamic damping factor. The damping preset table may be preset based on manual experience, and is configured to define corresponding damping factor values under different imbalance levels.

The correction matrix refers to a transition matrix that is obtained after performing regularization processing on the Jacobian matrix and has good numerical conditions. The correction matrix is positive definite and is configured to safely solve for an inverse matrix.

In some embodiments, the processor may perform a multiplication operation on the Jacobian matrix and the transpose matrix of the Jacobian matrix, and add a result of multiplying the dynamic damping factor by a unitary matrix of the same order, thereby obtaining the correction matrix, as shown in formula (9):

$$J^{\sim} = J^T J + \lambda I \tag{9}$$

In formula (9), $J^{\sim}$ is the correction matrix, $J^T$ is the transpose matrix, J is the Jacobian matrix, λ is the dynamic damping factor, and I is the unitary matrix of the same order. The unitary matrix of the same order refers to a unitary matrix that is of the same order as the correction matrix.

In some embodiments, the processor may perform an inversion operation on the correction matrix, left-multiply an inversion result by the transpose matrix of the Jacobian matrix, thereby obtaining the pseudoinverse matrix, as shown in formula (10):

$$J^{\sim} = \left(J^T J + \lambda I\right)^{-1} J^T \tag{10}$$

In some embodiments of the present disclosure, by introducing the dynamic damping factor for regularization inversion, sufficient numerical protection is provided to break through a dilemma of no solution when a system state fluctuates severely, while damping is intelligently reduced to restore original calculation accuracy when the system tends to converge. This manner both effectively resolves the problem of solution stability under an extremely ill-conditioned matrix and does not impair power flow calculation accuracy under normal convergence conditions, thereby achieving a balance between the high robustness and the high calculation accuracy.

In some embodiments, after determining that the voltage of the boundary node, the active power of the boundary node, and the reactive power of the boundary node satisfy the convergence condition in step S6, the method further includes: obtaining the grid-following impedance calculated in step S4, and monitoring an interactive power of the boundary node; determining whether a reverse power flow occurs based on the interactive power; in response to determining that the reverse power flow occurs and the grid-following impedance is greater than a preset impedance threshold, determining a deflected impedance polygon area and an adjusted current starting threshold respectively based on the grid-following impedance through a proportional scaling operation; determining whether a fault exists based on a power grid current signal, a power grid voltage signal, the deflected impedance polygon area, the adjusted current starting threshold, and a fault identification condition; in response to determining that the fault does not exist, controlling a circuit breaker of a relay to remain closed; in response to determining that the fault exists, sending a trip signal to the circuit breaker and controlling the circuit breaker to perform the opening.

The interactive power refers to the active power and the reactive power actually exchanged between the master system and the slave system at the boundary node. The numerical value and the direction of the interactive power reflect actual conditions of power flow. For example, at a current moment, if the master system transmits 10 MW of active power to the slave system, then the interactive power is 10 MW, and the direction is positive. If the slave system transmits power to the master system, the direction is negative.

In some embodiments, the processor may obtain the interactive power by real-time reading of a measurement data stream of an intelligent metering device (e.g., a high-precision boundary electricity meter) deployed at the boundary node.

The reverse power flow refers to an abnormal power flow phenomenon where a transmission direction of active power is opposite to a conventional direction, that is, where active power flows inversely from the slave system into the master system. For example, when a distributed photovoltaic power source within the slave system outputs power greater than a local load during a noon period, the excess active power flows inversely to the master system through the boundary node, thereby forming the reverse power flow.

In some embodiments, the processor may determine whether the reverse power flow occurs by monitoring a sign of an active component (i.e., active power) of the interactive power. When the sign of the active component of the interactive power is a negative value (taking injection of power from the master system to the slave system as a positive direction), the processor determines that the reverse power flow exists.

The preset impedance threshold refers to a critical impedance value configured to measure the strength of network support capability of the master system. When the grid-following impedance is greater than the preset impedance threshold, this indicates that the support of the master system for the boundary node is weak, and the boundary node is in a weak support state.

In some embodiments, the preset impedance threshold may be determined based on a preset value, for example, 0.3 per unit value.

The proportional scaling operation refers to an operation process that takes a difference between the grid-following impedance and the preset threshold as an independent variable, generates a proportional coefficient with upper and lower limit protection, and uses the proportional coefficient to perform multiplicative adaptive reconstruction on physical action setpoints of underlying protection equipment.

In some embodiments, a result of the proportional scaling operation includes a current coefficient and an impedance coefficient.

The current coefficient refers to a scaling factor configured to adjust the current starting threshold. In some embodiments, the current coefficient may range from not less than a minimum allowable multiple to not greater than 1. The minimum allowable multiple may be determined based on a preset, for example, 0.7.

The impedance coefficient refers to a scaling factor configured to adjust the impedance polygon area. In some embodiments, the impedance coefficient may range from not greater than a maximum allowable multiple to not less than 1. The maximum allowable multiple may be determined based on a preset, for example, 1.3.

In some embodiments, when the grid-following impedance is greater than the preset impedance threshold, the processor may multiply a difference between the grid-following impedance and the preset impedance threshold by a first preset adjustment ratio, and use a difference between 1 and the product as the current coefficient. The first preset adjustment ratio may be determined based on a preset.

In some embodiments, when the grid-following impedance is greater than the preset impedance threshold, the processor may multiply a difference between the grid-following impedance and the preset impedance threshold by a second preset adjustment ratio, and use a result of 1 plus the product as the impedance coefficient. The second preset adjustment ratio may be determined based on a preset, and the second preset adjustment ratio and the first preset adjustment ratio are independent of each other.

In some embodiments, if the reverse power flow occurs and the grid-following impedance is greater than the preset impedance threshold, the processor may obtain the current coefficient and the impedance coefficient, respectively, based on the grid-following impedance, through the proportional scaling operation, and calculate the deflected impedance polygon area and the adjusted current starting threshold based on the current coefficient and the impedance coefficient.

The impedance polygon area refers to a boundary range of a section or a plurality of sections of impedance operation characteristic regions in a distance protection device configured to determine whether a fault occurs within a protection zone. The impedance polygon is usually enclosed by connection lines of a plurality of vertex coordinates on a complex impedance plane, for example, a quadrilateral operation region enclosed by four sets of coordinate points.

The distance protection device refers to a relay protection device that determines a fault location and sends a trip signal based on a comparison result between the measured impedance and a setting impedance.

In some embodiments, the processor may obtain the impedance polygon area by reading and parsing a distance protection setting configuration file stored in a memory of a relay.

The deflected impedance polygon area refers to a new operation area obtained by proportionally enlarging or extending an original impedance polygon operation boundary when the reverse power flow occurs, to overcome an issue of the measured impedance being too large due to a small fault current and a boosting effect. For example, if a far-end vertex impedance of an original protection boundary is 20Ω, and the impedance coefficient is 1.2, the processor may enlarge the impedance polygon area according to the impedance coefficient, thereby extending the operation boundary to 24Ω, to ensure successful capture of a high impedance fault.

In some embodiments, the processor may multiply each vertex coordinate value (Ri, Xi) of the impedance polygon respectively by the calculated impedance coefficient K1 to obtain new vertex coordinates (Ri*, Xi*), and determine an area enclosed by connection lines of the new vertex coordinates as the deflected impedance polygon area.

The current starting threshold refers to a current threshold in a distance protection device configured to start fault identification. Only when a measured current exceeds the current starting threshold, the distance protection device enters a fault identification process. The current starting threshold may be determined based on a preset maximum load current during normal operation, for example, 600 A.

The adjusted current starting threshold refers to a current threshold obtained by adaptively reducing the current starting threshold through a proportional operation. Under the reverse power flow and weak support operating conditions, the fault current may be small, and reducing the current starting threshold may ensure a sensitivity of the distance protection device to the small fault current.

In some embodiments, the processor determines a product of the current coefficient and the current starting threshold as the adjusted current starting threshold. For example, an original current starting threshold is 600 A, the current coefficient is 0.8, and the adjusted current starting threshold is 480 A.

The power grid current signal and the power grid voltage signal refer to sampled characteristic values converted from physical analog quantities of alternating current signals that flow in real time on a physical line of a substation. In some embodiments, the processor may acquire the power grid current signal and the power grid voltage signal in real time by current transformers (CT) and voltage transformers (PT) installed on a transmission line at the site.

The fault identification condition refers to a logical rule set of a relay configured to logically confirm whether a fault occurs in the power grid.

In some embodiments, the fault identification condition may be preset manually. For example, the fault identification condition may include: whether the measured impedance calculated based on the power grid current signal and the power grid voltage signal falls within the deflected impedance polygon area, and whether the magnitude of the power grid current signal is greater than the adjusted current starting threshold.

In some embodiments, the processor calculates the current measured impedance based on the acquired power grid current signal and the power grid voltage signal, and determines whether the measured impedance falls within the deflected impedance polygon area, and simultaneously determines whether the magnitude of the power grid current signal is greater than the adjusted current starting threshold. When the measured impedance falls within the deflected impedance polygon area and the magnitude of the power grid current signal is greater than the adjusted current starting threshold, the processor determines that a fault exists; otherwise, the processor determines that no fault exists.

The trip signal refers to a control instruction configured to activate a circuit breaker operating mechanism to cut off a circuit. In some embodiments, the trip signal may be generated by a relay, acting on a trip coil of the circuit breaker in the form of a direct current pulse, causing the main contacts of the circuit breaker to separate, thereby cutting off a fault circuit.

In some embodiments, two conditions, namely, existence and non-existence of a fault, are known: in response to determining that no fault exists, the processor controls the circuit breaker of the relay to maintain a current closed state, thereby maintaining a normal power supply of the power grid; in response to determining that a fault exists, the processor sends the trip signal to the circuit breaker, and controls the circuit breaker to perform the opening operation, thereby isolating a fault portion from the power grid.

In some embodiments of the present disclosure, by applying the grid-following impedance obtained after convergence of joint power flow calculation of master-slave systems to adaptive adjustment of settings of an underlying relay protection device, a physical mapping from a steady-state power flow analysis result to a transient protection operation boundary is achieved. When the reverse power flow is detected and the master system support is weak, by dynamically adjusting the impedance polygon area and the current starting threshold through the proportional scaling operation, an issue of traditional fixed-setting protection being prone to maloperation or refusal to operate in a two-way power flow scenario of a high-proportion new energy distribution network is effectively solved, and an accuracy of relay protection operation and a security of power grid operation are significantly improved under complex operating conditions.

According to one or more embodiments of the present disclosure, a non-transitory computer-readable storage medium is provided. The storage medium stores computer instructions, wherein when a computer reads the computer instructions in the storage medium, the computer executes the method for joint power flow calculation of master-slave systems based on grid-following impedance as described above.

Figure 6:
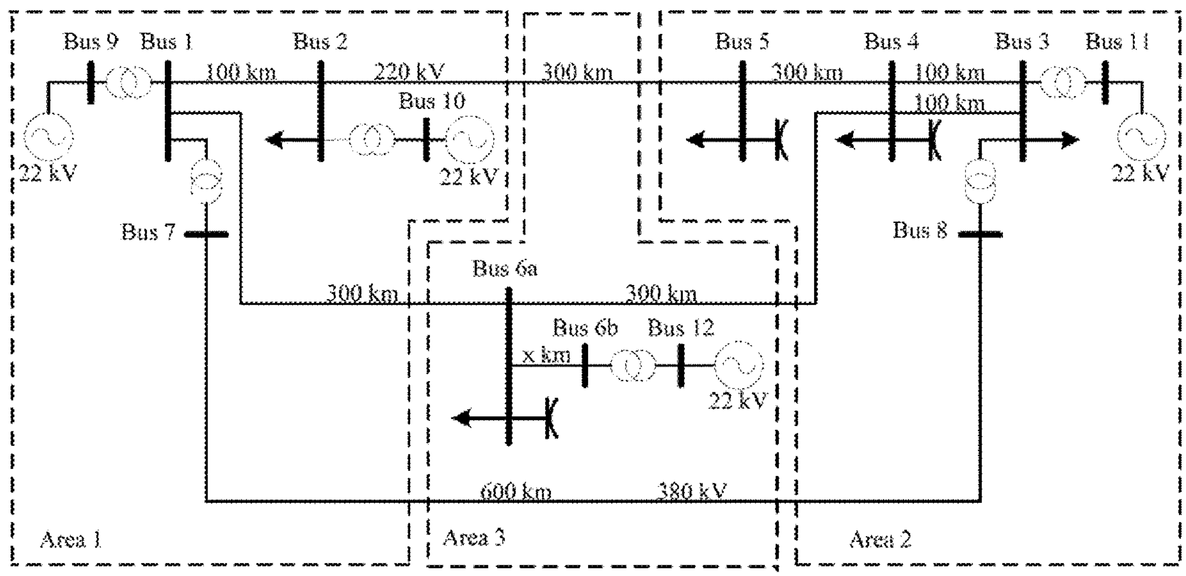
FIG. 6 is a topology diagram illustrating a test master system according to some embodiments of the present disclosure.
Figure 7:
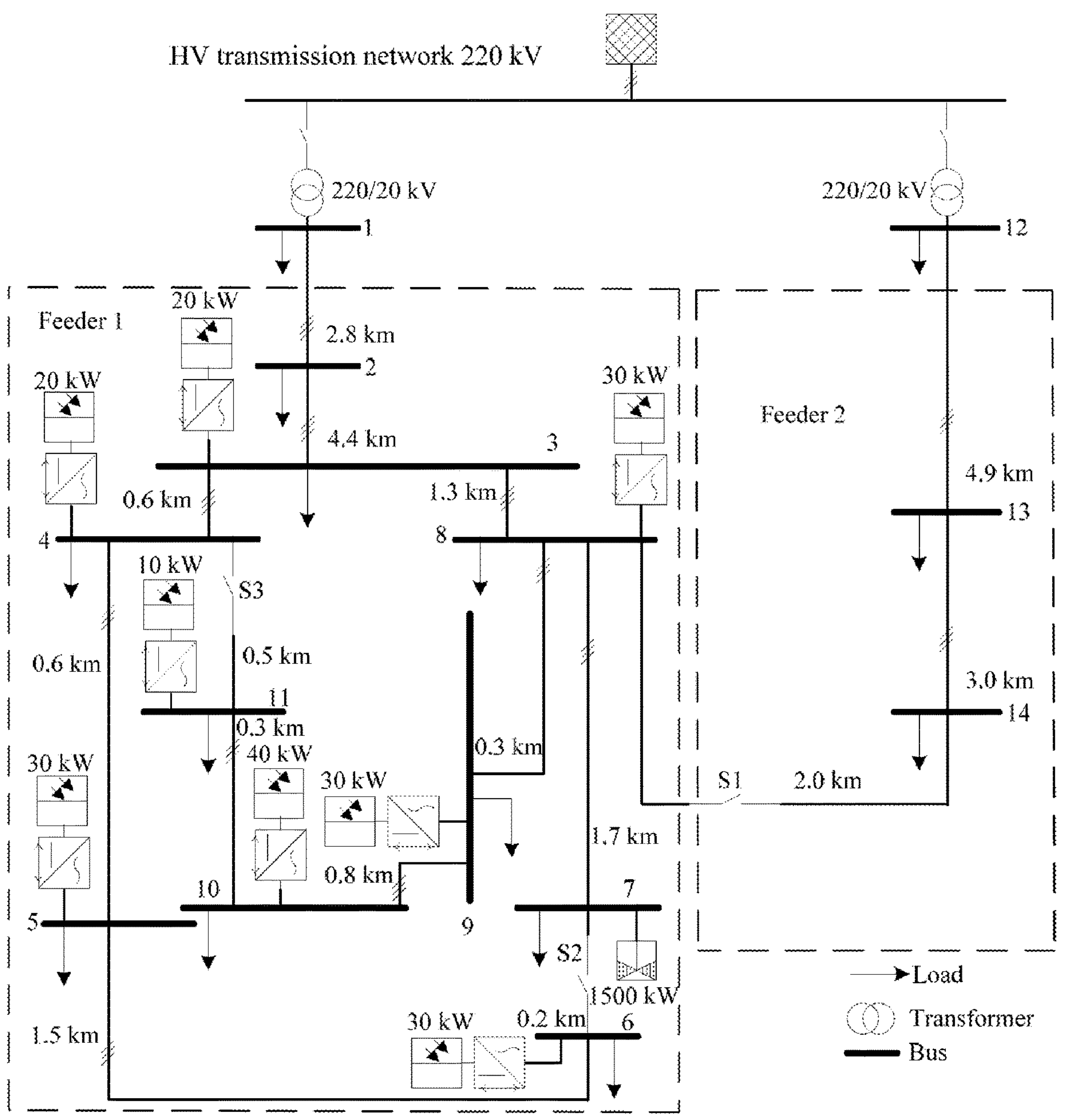
FIG. 7 is a topology diagram illustrating a test slave system according to some embodiments of the present disclosure.

FIG. 6 is a topology diagram illustrating a test master system according to some embodiments of the present disclosure; FIG. 7 is a topology diagram illustrating a test slave system according to some embodiments of the present disclosure.

The present disclosure provides a verification example of the method for joint power flow calculation of master-slave systems based on grid-following impedance as described above.

In the verification example, a Conseil International des Grands Réseaux Électriques (CIGRE) high voltage transmission network is a master system (see FIG. 6), a CIGRE medium voltage distribution network is a slave system (see FIG. 7), the slave system is connected at a BUS 5 position of the master system, replacing a load in the original master system, and all loads of the slave system are doubled.

In the verification example, the processor performs a comparative test on joint power flow calculation of master-slave systems employing the method for joint power flow calculation of master-slave systems based on grid-following impedance and joint power flow calculation of master-slave systems not employing the method for joint power flow calculation of master-slave systems based on grid-following impedance, sets a convergence condition to be that an active power error of the slave system is less than 0.001 MW, and calculation results of active power of the slave system are shown in Table 1:

TABLE 1

Calculation results of Active power of the Slave system

| Count of iterations | Method of the Present Disclosure | Method Not of the Present Disclosure |
|---|---|---|
| 1 | 88.96824746349421 | 88.96824746349421 |
| 2 | 89.55019523778536 | 89.35247607758573 |
| 3 | 89.49131683906627 | 89.45753609524985 |
| 4 | 89.49749257052669 | 89.48619161962425 |
| 5 | 89.49684510347902 (converged) | 89.49399187288496 |
| 6 | | 89.49611380083714 |
| 7 | | 89.49669093103071 (converged) |

As can be seen from Table 1, after adopting the method for joint power flow calculation of master-slave systems based on grid-following impedance, the count of iterations is reduced (i.e., 5 iterations when using the method for joint power flow calculation of master-slave systems based on grid-following impedance, versus 7 iterations without using the method for joint power flow calculation of master-slave systems based on grid-following impedance), thereby facilitating the improvement of the efficiency of the joint power flow calculation of the master-slave systems.

While the specific embodiments of the present disclosure have been described in conjunction with the accompanying drawings, they are not intended to limit protection scope of the present disclosure. A person skilled in the art should understand that, based on a technical solution of the present disclosure, various modifications or variations that can be made by a person skilled in the art without inventive efforts still fall within the protection scope of the present disclosure.

What is claimed is:

1. A method for joint power flow calculation of master-slave systems based on grid-following impedance, comprising:

step S1, dividing a power system into a master system and at least one slave system, and determining a boundary node; adding a virtual slack node in the at least one slave system, and setting grid-following impedance between the virtual slack node and the boundary node to constitute a virtual slave system;

step S2, setting a voltage of the boundary node as an initial value, calculating power flow of the at least one slave system, and obtaining slave system power of the boundary node;

step S3, setting power of the boundary node as the slave system power, calculating power flow of the master system, obtaining the voltage of the boundary node, a corresponding element between a voltage magnitude correction value of the boundary node and an active power imbalance of the boundary node, and a corresponding element between the voltage magnitude correction value of the boundary node and a reactive power imbalance of the boundary node in an inverse Jacobian matrix calculated based on the power flow of the master system;

step S4, according to the corresponding elements of the inverse Jacobian matrix, the voltage of the boundary node, and the slave system power, calculating a resistance value and a reactance value of the grid-following impedance, and calculating a voltage of the virtual slack node;

step S5, calculating power flow of the virtual slave system based on the grid-following impedance and the voltage of the virtual slack node, and obtaining new slave system power from the boundary node;

step S6, determining whether the voltage of the boundary node, an active power of the boundary node, and a reactive power of the boundary node satisfy a convergence condition, and in response to determining that the convergence condition is satisfied, ending the calculation, or in response to determining that the convergence condition is not satisfied, returning to step S3 to continue iteration;

wherein the resistance value of the grid-following impedance is determined by multiplying the voltage of the boundary node by the corresponding element between the voltage magnitude correction value of the boundary node and the active power imbalance of the boundary node in the inverse Jacobian matrix; and the reactance value of the grid-following impedance is determined by multiplying the voltage of the boundary node by the corresponding element between the voltage magnitude correction value of the boundary node and the reactive power imbalance of the boundary node in the inverse Jacobian matrix.

2. The method according to claim 1, wherein the voltage $V_C$ of the virtual slack node is:

$$V_C = \sqrt{\left(V_B + \frac{P_B R_D + Q_B X_D}{V_B}\right)^2 + \left(\frac{P_B X_D - Q_B R_D}{V_B}\right)^2}$$

wherein $R_D$ denotes the resistance value of the grid-following impedance, $X_D$ denotes the reactance value of the grid-following impedance, $V_B$ denotes the voltage of the boundary node, $P_B$ denotes the active power of the boundary node, and $Q_B$ denotes the reactive power of the boundary node.

3. The method according to claim 1, wherein the initial value of the voltage of the boundary node in step S2 is a rated voltage.

4. The method according to claim 1, wherein the boundary node in step S3 is an active-reactive power (PQ) node, and the virtual slack node in step S5 is a slack node.

5. The method according to claim 4, wherein in the calculation of the power flow of the virtual slave system in step S5, a power loss on the grid-following impedance is not included in the slave system power.

6. The method according to claim 4, wherein the convergence condition in step S6 includes: in a current iteration, differences between calculation results of the voltage of the boundary node, the active power of the at least one slave system, and the reactive power of the at least one slave system and calculation results of a previous iteration are all less than a preset error threshold, or a count of iterations exceeds a preset upper limit.

7. The method according to claim 1, wherein the master system is a transmission network, the at least one slave system is a distribution network, and the boundary node is a low-voltage busbar of a substation.

8. The method according to claim 7, wherein the at least one slave system includes a plurality of slave systems, each of the plurality of slave systems is calculated independently, and the master system coordinates iteration uniformly.

9. The method according to claim 7, wherein the calculating the power flow of the master system employs a Newton-Raphson manner, and the calculating the power flow of the at least one slave system employs a forward-backward sweep manner or the Newton-Raphson manner.

10. The method according to claim 9, wherein the grid-following impedance is dynamically updated after each calculation of the power flow of the master system.

11. The method according to claim 1, wherein after determining that the voltage of the boundary node, the active power of the boundary node, and the reactive power of the boundary node satisfy the convergence condition in step S6, the method further comprises:

- generating a voltage support state variable of the boundary node based on the grid-following impedance, and the voltage of the boundary node, the active power of the boundary node, and the reactive power of the boundary node when the convergence condition is satisfied;
- determining a voltage regulation mode of the boundary node based on the voltage support state variable;
- according to the voltage regulation mode of the boundary node, controlling a circuit breaker operating mechanism to perform mechanical closing and opening, to physically connect or disconnect a shunt capacitor bank or a reactor to or from a power grid.

12. The method according to claim 1, wherein after calculating the inverse Jacobian matrix in step S3, the method further comprises:

- calculating a condition number of an Jacobian matrix of the inverse Jacobian matrix;
- in response to the condition number being not less than a preset condition threshold, obtaining a pseudoinverse matrix of the Jacobian matrix;
- extracting a target element from the pseudoinverse matrix, updating the corresponding elements in the inverse Jacobian matrix according to the target element to obtain updated corresponding elements, and using the updated corresponding elements of the inverse Jacobian matrix to participate in the calculation of step S4.

13. The method according to claim 12, wherein the obtaining the pseudoinverse matrix of the Jacobian matrix includes:

- determining a dynamic damping factor based on the active power imbalance of the boundary node and the reactive power imbalance of the boundary node;
- determining a correction matrix based on the Jacobian matrix, a transpose matrix of the Jacobian matrix, and the dynamic damping factor;
- determining the pseudoinverse matrix based on the correction matrix and the transpose matrix of the Jacobian matrix.

14. The method according to claim 1, wherein after determining that the voltage of the boundary node, the active power of the boundary node, and the reactive power of the boundary node satisfy the convergence condition in step S6, the method further comprises:

- obtaining the grid-following impedance calculated in step S4, and monitoring an interactive power of the boundary node;
- determining whether a reverse power flow occurs based on the interactive power;
- in response to determining that the reverse power flow occurs and the grid-following impedance is greater than a preset impedance threshold, determining a deflected impedance polygon area and an adjusted current starting threshold respectively based on the grid-following impedance through a proportional scaling operation;
- determining whether a fault exists based on a power grid current signal, and a power grid voltage signal, the deflected impedance polygon area, the adjusted current starting threshold, and a fault identification condition;
- in response to determining that the fault exists, controlling a circuit breaker of a relay to remain closed;
- in response to determining that the fault does not exist, sending a trip signal to the circuit breaker and controlling the circuit breaker to perform an opening.

15. A non-transitory computer-readable storage medium storing computer instructions, wherein when a computer reads the computer instructions in the storage medium, the computer executes the method for joint power flow calculation of master-slave systems based on grid-following impedance according to claim 1.

16. A system for joint power flow calculation of master-slave systems based on grid-following impedance, including:

- a system partition module, configured to: divide a power system into a master system and at least one slave system, and determine a boundary node; add a virtual slack node in the at least one slave system, and set grid-following impedance between the virtual slack node and the boundary node to constitute a virtual slave system;
- an initial value calculation module, configured to: set a voltage of the boundary node as an initial value, calculate power flow of the at least one slave system, and obtain slave system power of the boundary node;
- a master system calculation module, configured to: set power of the boundary node as the slave system power, calculate power flow of the master system, obtain the voltage of the boundary node and a corresponding element between a voltage magnitude correction value of the boundary node and an active power imbalance of the boundary node, and a corresponding element between the voltage magnitude correction value of the boundary node and a reactive power imbalance of the boundary node in an inverse Jacobian matrix calculated based on the power flow of the master system;
- an impedance determination module, configured to: according to the corresponding elements of the inverse Jacobian matrix, the voltage of the boundary node, and the slave system power, calculate a resistance value and a reactance value of the grid-following impedance, and calculate a voltage of the virtual slack node;
- a virtual power flow module, configured to: calculate power flow of the virtual slave system based on the grid-following impedance and the voltage of the virtual slack node, and obtain new slave system power from the boundary node;
- a convergence determination module, configured to: determine whether the voltage of the boundary node, an active power of the boundary node, and a reactive power of the boundary node satisfy a convergence condition, and in response to determining that the convergence condition is satisfied, end the calculation, or in response to determining that the convergence condition is not satisfied, return to step S3 to continue iteration;

wherein the resistance value of the grid-following impedance is determined by multiplying the voltage of the boundary node by the corresponding element between the voltage magnitude correction value of the boundary node and the active power imbalance of the boundary node in the inverse Jacobian matrix; and the reactance value of the grid-following impedance is determined by multiplying the voltage of the boundary node by the corresponding element between the voltage magnitude correction value of the boundary node and the reactive power imbalance of the boundary node in the inverse Jacobian matrix.

17. The system according to claim 16, wherein the voltage $V_C$ of the virtual slack node is:

$$V_C = \sqrt{\left(V_B + \frac{P_B R_D + Q_B X_D}{V_B}\right)^2 + \left(\frac{P_B X_D - Q_B R_D}{V_B}\right)^2}$$

wherein $R_D$ denotes the resistance value of the grid-following impedance, $X_D$ denotes the reactance value of the grid-following impedance, $V_B$ denotes the voltage of the boundary node, $P_B$ denotes the active power of the boundary node, and $Q_B$ denotes the reactive power of the boundary node.

18. The system according to claim 16, wherein the initial value of the voltage of the boundary node is a rated voltage.

19. The system according to claim 16, wherein the boundary node is an active-reactive power (PQ) node, and the virtual slack node is a slack node.

20. The system according to claim 16, wherein the master system is a transmission network, the at least one slave system is a distribution network, and the boundary node is a low-voltage busbar of a substation.

* * * * *